United States Patent
Ballagh et al.

(10) Patent No.: US 7,433,813 B1
(45) Date of Patent: Oct. 7, 2008

(54) EMBEDDING A CO-SIMULATED HARDWARE OBJECT IN AN EVENT-DRIVEN SIMULATOR

(75) Inventors: Jonathan B. Ballagh, Longmont, CO (US); L. James Hwang, Menlo Park, CA (US); Roger B. Milne, Boulder, CO (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 720 days.

(21) Appl. No.: 10/850,178

(22) Filed: May 20, 2004

(51) Int. Cl.
*G06F 17/50* (2006.01)
(52) U.S. Cl. .............. 703/16; 716/16; 326/39
(58) Field of Classification Search .......... 703/14, 703/22, 16, 27; 716/1, 11, 16; 326/38, 39
See application file for complete search history.

(56) References Cited

U.S. PATENT DOCUMENTS

| 5,535,342 | A | 7/1996 | Taylor | |
|---|---|---|---|---|
| 6,487,709 | B1 * | 11/2002 | Keller et al. | 716/14 |
| 6,725,441 | B1 * | 4/2004 | Keller et al. | 716/16 |
| 6,883,147 | B1 * | 4/2005 | Ballagh et al. | 716/1 |
| 6,911,840 | B1 * | 6/2005 | Milne et al. | 326/38 |
| 7,003,751 | B1 * | 2/2006 | Stroomer et al. | 716/11 |
| 7,203,632 | B2 | 4/2007 | Milne et al. | |
| 2004/0049609 | A1 | 3/2004 | Simonson et al. | |
| 2006/0179417 | A1 | 8/2006 | Madurawe | |
| 2007/0043939 | A1 | 2/2007 | Fallon et al. | |

OTHER PUBLICATIONS

Indrusiak et al., Ubiquitous Access to Reconfigurable Hardware: Application Scenarios and Implementation Issues, Proceedings of the Design Automation and Test in Europe Conference and Exhibition, Mar. 2003, pp. 940-945.*

U.S. Appl. No. 10/850,133, filed on May 20, 2004, Ballagh et al.

Xilinx, Inc.; System Generator for DSP; User's Guide; "Automatic Code Generation" and "Hardware Co-Simulation Blocks"; Version 9.1; Feb. 16, 2007; available from Xilinx, Inc., 2100 Logic Drive, San Jose, California 95124; pp. 60; 193.

U.S. Appl. No. 10/388,681 by Milne et al filed by Xilinx Inc. on Mar. 14, 2003.

(Continued)

*Primary Examiner*—Russell Frejd
(74) *Attorney, Agent, or Firm*—LeRoy D. Maunu; Lois D. Cartier

(57) ABSTRACT

Various approaches for embedding a hardware object in an event-driven simulator are disclosed. The various approaches involve generating an HDL proxy component having an HDL definition of each port of the hardware object and respective event handler functions associated with input ports of the HDL proxy component. The event handler functions are responsive to simulation events appearing on the input ports. A configuration bitstream is generated for implementing the hardware object on a programmable logic circuit, and a first object is generated to contain configuration parameter values indicating characteristics of the ports and a location of the configuration bitstream. A second object is generated and is configured to initiate configuration of the programmable logic circuit with the configuration bitstream. The second object further provides input data to and receives output data from the programmable logic circuit.

22 Claims, 6 Drawing Sheets

OTHER PUBLICATIONS

Stuart Sutherland; "The Verilog PLI Handbook"; A User's Guide and Comprehensive Reference; Kluwer Academic Publishers; Copyright 1999 by Kluwer Academic Publishers; pp. 36-37.

Mentor Graphics; "ModelSim SE Foreign Language Interface"; Version 6.1e; published Mar. 2006; Copyright Mentor Graphics Corporation 2006; pp. 10-25.

* cited by examiner

HDL Proxy Component Example

```
entity fli_wrapper_ex is
  generic (
    port_names: string := "in_A,in_B,out_A";
    port_widths: string := "8,4,16";
    bitfile_location: string := "c:\cosim_work\test.bit"
  );
  port (
    in_A: in std_logic_vector(11 downto 0);
    in_B: in std_logic_vector(27 downto 0);
    out_A: out std_logic;
    clk: out std_logic;
  );
end fli_wrapper_ex;
architecture structural of fli_wrapper_ex is attribute foreign : string;
  attribute foreign of only : architecture is "cosim_init ./hwcosim.dll";

begin
end structural;
```

FIG. 2

Constructing a Configuration Parameters Object

```
ConfigParams cp;
GenericIterator g;
GenericsList g_list;

g_list = get_component_generics();

for (g = g_list.begin(); g != g_list.end(); g++)
{
  if (g->getType() == STRING_TYPE)
    cp.addString(g->getName(), g->getValue());
  else if (g->getType() == ARRAY_TYPE)
    cp.addArray(g->getName(), g->getValue());
  ...
}
```

Clock Event Function                          404

```
void clk1_event(specialized_hardware_object cs)
{
  Port clk = this.getClkPort();
  if (clk.getValue() == 1)  }  // Check if clock is asserted.
    cs.run(1); // Step the co-simulation engine 1 cycle.
  }
  update_outputs(cs); // Update output values.         406
}                                               408
```

Input Port Callback Function

```
void inp1_event(specialized_hardware_object cs)
{
  // Force the hardware input port value with value of HDL port.
  cs.force(PORT_1, this.getInPort(PORT_1).getValue());   434 update_outputs(cs); // Call function to update output values.  438
} void inp2_event(CosimEngine cs)
{
  // Force the hardware input port value with value of HDL port.
  cs.force(PORT_2, this.getInPort(PORT_2).getValue());   436 update_outputs(cs); // Call function to update output values.  440

Update Outputs Function

```
void update_outputs(specialized_hardware_object cs)
{
  Port p;

// Examine hardware outputs and set the HDL port values accordingly.
  for (int i = 0; i < cs.getNumOutputPorts(); i++) {   474
    p = getOutPort(i); // Get handle to HDL output port.
    p.setValue(cs.examine(i)); // Set value of HDL port to hardware value.  476
  }
}
```

FIG. 8

EMBEDDING A CO-SIMULATED HARDWARE OBJECT IN AN EVENT-DRIVEN SIMULATOR

FIELD OF THE INVENTION

The present invention generally relates to co-simulation.

BACKGROUND

A high level modeling system (HLMS) is a software tool in which electronic designs can be described, simulated, and translated by machine into a design realization. An HLMS provides a higher level of abstraction for describing an electronic circuit than a hardware description language (HDL) simulation environment such as the ModelSim environment from the Model Technology Company. An HLMS generally provides a mathematical representation of signals as compared to standard logic vectors in a hardware description language (HDL). It is desirable for the high-level abstractions to be precisely correlated with the ultimate implementation representation, both in simulation semantics and in implementation. The Xilinx System Generator tool for DSP (Sysgen) and the MathWorks' Simulink and MATLAB environments are examples of such HLMSs.

An HLMS for electronic circuit design generally offers abstractions that are not available in traditional HDLs. For example, an HLMS is likely to offer abstractions that relate to signal propagation and signal state, while an HDL may support a detailed representation that more closely models a realized electronic circuit. An electronic design modeled in an HLMS may be viewed as a collection of components that communicate through signals. Signals are discrete, time-varying sequences of values. An HLMS generally provides abstractions to support implementing synchronous designs without requiring the specification of explicit references to clocks or clock signals. Instead of providing a detailed, event driven simulation, an HLMS may also provide abstractions wherein clock-synchronous state changes are scheduled to occur at regular intervals and in which there is no notion of the timing characteristics related to the intended implementation as an electronic circuit. In further support of creating high-level designs, an HLMS may also represent state in terms of numerical (or other abstract) values instead of representing state in a detailed format analogous to standard logic vectors.

An HLMS such as Sysgen also has the capability to generate objects for co-simulating using a hardware platform. Co-simulation generally refers to dividing a design into portions and simulating the portions on two or more platforms. There are different types of platform on which designs may be co-simulated.

Example co-simulation platforms include both software-based and hardware-based systems. The Modelsim simulator and the NC-SIM simulator from Cadence are example software-based systems, and the Wildcard and Benone hardware-based platforms from Annapolis Microsystems and Nallatech, respectively, are example hardware-based systems. The WildCard and Benone board are often used for algorithm exploration and design prototyping and include programmable logic devices (PLDs). In software-based co-simulations, the user may perform a behavioral simulation or perform simulation using a synthesized and mapped version of the design.

In a hardware-based system, a portion of the design is emulated on a hardware platform that includes a programmable logic device (PLD), such as a field programmable gate array (FPGA). Co-simulating on a hardware platform may be used to reduce the time required for a simulation run.

The hardware objects created by the present Sysgen system for hardware co-simulation are useful only in the Simulink system. The Simulink system encapsulates the hardware object in a run-time block, and the parameters used by the objects for initialization and operation are specific to the Simulink system. Thus, the hardware objects created by the present Sysgen system are incompatible with co-simulation frameworks other than the Simulink system.

The present invention addresses one or more of the above issues.

SUMMARY OF THE INVENTION

The various embodiments of the invention support embedding a hardware object in an event-driven simulator. An HDL proxy component is generated and has an HDL definition of each port of the hardware object and respective event handler functions associated with input ports of the HDL proxy component. The event handler functions are responsive to simulation events appearing on the input ports. A configuration bitstream is generated for implementing the hardware object on a programmable logic circuit, and a first object is generated to contain configuration parameter values indicating characteristics of the ports and a location of the configuration bitstream. A second object is generated and is configured to initiate configuration of the programmable logic circuit with the configuration bitstream. The second object further provides input data to and receives output data from the programmable logic circuit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 2 is a code block of an example HDL proxy;

FIG. 3 is an example code block for constructing the configuration parameters object;

FIG. 6 is a code block of an example clock event function;

FIG. 7 is a code block of two example input port callback functions;

FIG. 8 is a code block of an example update outputs function; and

DETAILED DESCRIPTION

The various embodiments of the invention provide access to an application-independent hardware object that is realized in an event-driven simulation. In one embodiment, an HDL component functions as a proxy between the simulation environment and underlying hardware on which the functions of the component are simulated, and includes an HDL definition of each port of the hardware object and respective event handler functions associated with the input ports of the HDL proxy component. Each of the input ports is responsive to simulation events appearing at that input ports. The hardware object is realized on a programmable logic circuit configured with a configuration bitstream. A object of configuration parameters is used to encapsulate and communicate to a specialized hardware object port characteristics, design behavior characteristics, and the location of the configuration bitstream. The specialized hardware object includes functions that are callable by the event handler functions of the HDL proxy for configuring the programmable logic circuit and handling input data to and output data from the programmable logic circuit.

In an example implementation, an HLMS such as the Sysgen system may be used to generate a hardware implementation of a part of a design to be co-simulated on a hardware platform. The part of the design to be co-simulated on a hardware platform is referred to as a specialized hardware object. The specialized hardware object is accompanied by an application-independent programming interface through which an object in a software-based simulator, such as the Simulink system, may control the specialized hardware object. The object in the software simulator need not know the interface details of the hardware platform.

Figure 1:
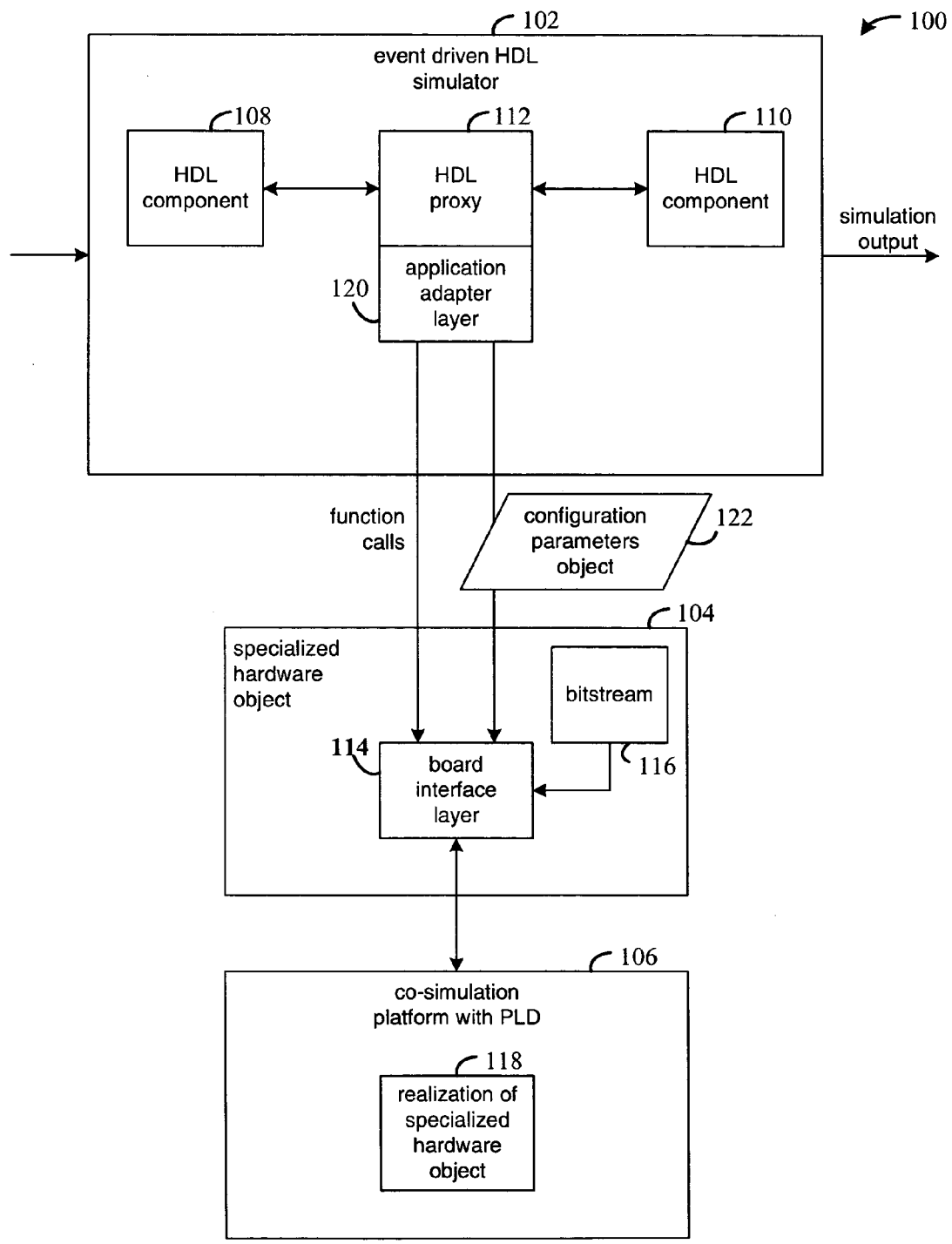
FIG. 1 is a block diagram of a logic simulation system with a portion of the simulated design realized on a PLD-based co-simulation platform.

FIG. 1 is a block diagram of a logic simulation system with a portion of the simulated design realized on a PLD-based co-simulation platform. The portion of the design that is realized in hardware is encapsulated in an application-independent, specialized hardware object, which provides a generic interface. Encapsulating a portion of a design provides benefits such as reducing simulation time and handling incompatible simulation languages.

The major functional blocks in the simulation framework 100 include HDL simulator 102, specialized hardware object 104, and co-simulation platform 106. The HDL simulator is an event-driven simulator, such as the ModelSim system, which functionally simulates a design that includes various HDL components such as components 108 and 110. HDL proxy component 112 encapsulates for the simulator 102 the portion of the design that is co-simulated in hardware. From a user's perspective, the HDL proxy component is used in a manner similar to other HDL components in the design's testbench. The proxy component provides an HDL interface through which the simulator (and other HDL components) can communicate with the realization 118 of the specialized hardware object 104.

The HDL proxy component 112 interacts with other HDL components 108 and 110 in the simulation environment by way of port interfaces that are described using the standard semantics of the HDL language. The proxy component's port interface (e.g., port names, types, and widths) matches the port interface of the high-level model from which the specialized hardware object was generated. Thus, a custom HDL proxy component is created for each specialized hardware object in order to ensure the port interfaces and configuration parameters match. A custom proxy component may be created whenever a design is compiled for hardware co-simulation by an HLMS.

Adapter layer 120 provides the interface between HDL proxy 112 and the specialized hardware object 104. The adapter layer may be realized using the C programming interfaces provided by various HDL simulators. It will be appreciated that the adapter layer may be implemented in any language that provides access to C language interfaces.

The adapter layer obtains design-specific and simulator-specific parameters values from the HDL proxy and simulator 102 and creates configuration parameters object 122. The configuration parameters object is provided to the specialized hardware object 104 so that the specialized hardware object can be used independent of the interface particulars of the simulator 102. The adapter layer allows event driven HDL simulation environments to access the many advantages afforded by hardware co-simulation.

The specialized hardware object 104 is an object (an object-oriented programming object) that provides the interface between the simulator 102 and the co-simulation platform 106. The specialized hardware object includes a board interface layer 114 that handles the hardware-level interface to the co-simulation platform 106. The co-simulation platform includes a PLD (not shown) that is configured with configuration bitstream 116, and the configured PLD provides a realization 118 of the specialized hardware object.

The board interface layer 114 includes a set of program-callable functions that are available to the application layer 120. The board interface layer implementation is independent of the simulator 102. However, the board interface layer needs certain information from the simulator, such as, data widths, data rates, and data types associated with ports of the HDL proxy 112. The location of the configuration bitstream is also provided to the board interface layer so that the board interface layer can obtain the bitstream for configuring the PLD on the co-simulation platform. This information is passed to the board interface layer using the configuration parameters object 122.

Further description of the specialized hardware objects may be found in the commonly assigned, co-pending patent application entitled, "EMBEDDING A HARDWARE OBJECT IN AN APPLICATION SYSTEM" by Jonathan B. Ballagh et al., filed concurrent with the present application, the contents of which are herein incorporated by reference.

FIG. 2 is a code block of an example HDL proxy 202. An HLMS may be used to describe the design of the co-simulated hardware object. During the compilation of this design, the bitstream for the co-simulated hardware object and an interface file are generated. At a minimum, the interface file contains the definitions of ports of the co-simulated hardware object. This file may also contain other types of characteristics about the design, including compilation parameters (e.g., name and type of the target platform, file path information), clocking characteristics (e.g., internal clock period), and even netlist descriptions of internal components in the design. The information from the interface file can be reformatted to generate the HDL proxy. Included in the HDL proxy are HDL definitions of the ports specified by the design, and port descriptions that may be queried to build the configuration parameters object 122. Also included in the HDL proxy is a definition of the FPGA bitstream to use for device configuration.

In an example implementation, the HDL proxy 112 interfaces to a C model in order to define its simulation behavior, instead of HDL code. The C library implements the adapter layer 120 by building the configuration parameters object 122 and communicating with the board interface layer 114. In one embodiment, the example HDL proxy 202 uses the ModelSim foreign language interface (FLI) with the entry point and filename for the application adapter layer. The way a component specifies this library is by declaring a foreign attribute that specifies the library to use for simulation and the entry point into that library.

For example, in the VHDL program code 202, the foreign attribute specifies a DLL named hwcosim.dll 204, and an entry point (i.e., a function provided by the DLL's interface) named cosim_init 206. It will be appreciated that beyond the declaration of the foreign attribute, the rest of architecture structural 208 is empty.

An HDL proxy component is tailored to the specialized hardware object that is being co-simulated. That is, each specialized hardware object is accompanied by a unique HDL proxy component. One way this component could be produced is by using a wrapper builder that is part of a high-level modeling system (HLMS), such as the Sysgen system. A wrapper builder may be implemented as a program that constructs an HDL wrapper around the hardware representation (e.g., HDL, EDIF, or NGC) of the high-level design under test (DUT) in the HLMS. The DUT corresponds to the portion of the high-level design that is being translated from a high level description into hardware.

A wrapper builder accesses the interface file to obtain the port description information (e.g., port names, types, widths, etc.) of the DUT. The wrapper builder may further use the interface file to determine the name and path of the FPGA bitstream that is generated during compilation. This information may be stored in a separate interface file that is produced when the DUT is compiled by the HLMS. The wrapper builder uses this information to construct a netlist in which the DUT may be connected to one or more external interfaces (e.g., clock generation logic, testbench machinery, or board-specific IP). The wrapper builder could be invoked either within the HLMS during code generation, or after compilation and outside the HLMS if an appropriate interface file exists for the DUT.

FIG. 3 is an example code block 252 for constructing the configuration parameters object (FIG. 1, 122). This code block determines the port characteristics from information included in and associated with the HDL proxy. In one embodiment, the code for constructing the configuration parameters object may be part of application adapter layer 120.

In one embodiment, the ModelSim FLI provides methods for examining the generic names and values associated with a foreign architecture component. The pseudo code for using these methods to construct a configuration parameters object is illustrated in code block 252. The code iterates (254) through the list of generics (256) and constructs (258) a corresponding configuration parameters object that stores the generics' names and values as key/value pairs, respectively.

The configuration parameters object may be built when the adapter layer 120 is initialized, for example, in an adapter layer's class constructor. In another embodiment involving an implementation with the Simulink system, the adapter layer generates the configuration parameters object by examining the mask parameters of the run-time co-simulation block. In a similar manner, an HDL simulator adapter layer may build the mask parameters object using generic values defined in the HDL proxy component 112. This requires that the generic and generic values are added to the custom proxy component by the HLMS when the design is compiled for hardware co-simulation.

Figure 4:
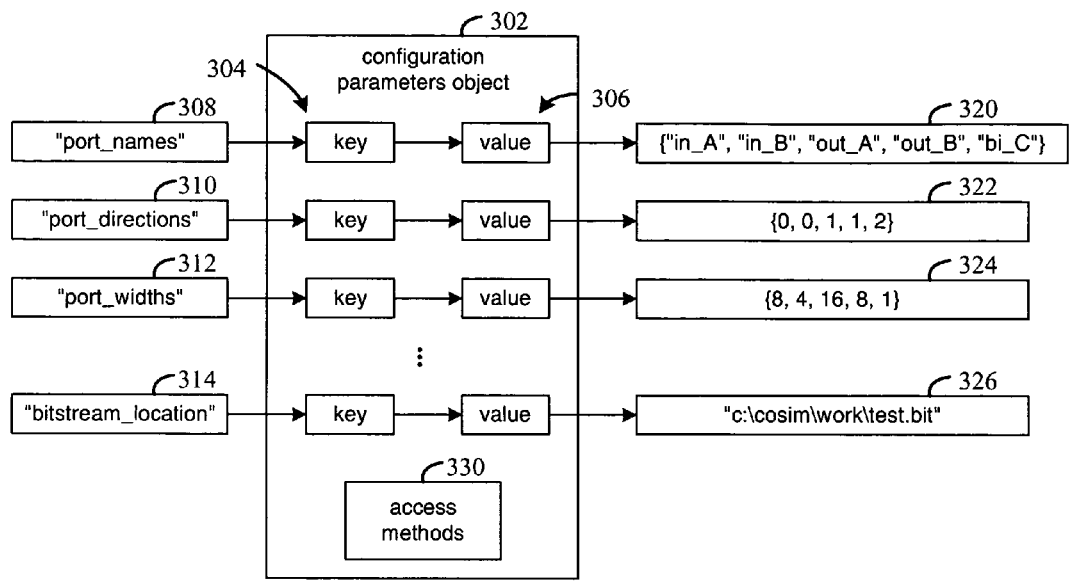
FIG. 4 is a block diagram of an example configuration parameters object.

FIG. 4 is a block diagram of an example configuration parameters object 302. A set of keys 304 is used to obtain values 306 of port_names 308, port_directions 310, port_widths 312, and the bitstream_location 314 (file name and location of the bitstream to use in configuring the PLD). Example corresponding values of the port_names are the set 320 of port names, in_A, in_B, out_A, out_B, and bi_C. The set 322 of port directions indicates directions of the set of ports 320. A 0 value indicates an input port, a 1 value indicates an output port, and 2 value indicates a bi-directional port. Set 324 specifies the widths in bits of the named ports. The example value 326 of the bitstream_location is represented by the character string, c:\cosim\work\test.bit.

The configuration parameter object further includes design behavior characteristics such as whether the design has a combinational path from an input port to an output port. For example, the configuration parameters object includes the generic, "hasCombinationalPath:string:="true", which indicates whether the design contains at least one path from an input port to an output port with no sequential (i.e., clocked) elements. In other words, a change on an input may affect an output port without a clock event. This information can be used to make certain optimizations in the adapter layer. For example, if the design does not include a combinational path, the adapter layer need not update the output port states when the value of an input port changes. This improves co-simulation performance since it reduces the number of transactions required between the adapter layer and the hardware-based co-simulation platform. Whether a design has a combinational path may be determined using known analysis techniques.

The configuration parameters object also includes methods 330 for adding and retrieving various types of data using the key-value pairs. The methods further include error handling and type checking routines. The board interface layer 114 is passed the configuration parameters object 302 when the board interface layer is initialized. The board interface layer retrieves the configuration information it requires by indexing into the configuration parameters object with a fixed set of key strings (e.g., "bitstream_location"). The board interface layer only reads data from this object, and does not modify its contents.

Figure 5A:
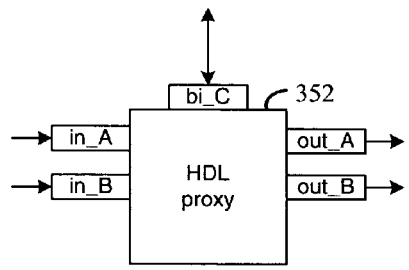
FIG. 5A illustrates an example HDL proxy component with input and output ports corresponding to the example configuration parameters the object of FIG. 4.
Figure 5B:
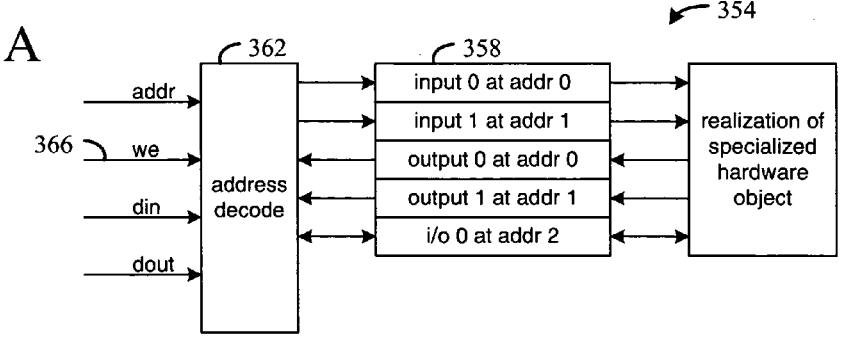
FIG. 5B illustrates a memory map implemented for the HDL proxy component of FIG. 4.

FIG. 5A illustrates an example HDL proxy component 352 with input and output ports corresponding to the example configuration parameters object 302 of FIG. 4, and FIG. 5B illustrates a memory map 354 implemented for the HDL proxy component 352.

The memory map interface 354 is generated when an HLMS such as Sysgen implements a design for hardware co-simulation. The design under test, or DUT (i.e., the portion of the model that is being compiled), is translated into a corresponding HDL description, and a custom HDL wrapper is created for the DUT with logic (memory map, bus interfaces, etc.) to support communication with the board interface layer 114 and realization of the specialized hardware object.

The memory map interface 354 reserves a portion of memory in the PLD for storage of input and output values for the realization of the specialized hardware object. Elements 358 of the memory map correspond to I/O ports on the HDL proxy component 352. The board interface layer 114 reads and writes to specific ports on the realization of the specialized hardware object by generating an address that the address decode logic 362 is able to decode. The address is computed using the index of port to generate an address offset that references one of elements 358.

Each pair of input and output ports share an index value. For example, input port, in_A, and output port out_A may share the index value 0. Address decode logic 362 determines the direction of the data flow by the state of the we signal on line 366. Thus, the index value 0 for in_A and out_A may both reference addr0, with the we signal state determining the flow of data.

The adapter layer 120 translates events in the simulator 102 into calls to corresponding functions in the board interface layer 114. In an event driven simulator, these events correspond to signal activity on the I/O ports of the HDL proxy component 112. The adapter layer is configured to respond to events that occur at the ports of the HDL proxy component in order to synchronize the realization of the specialized hardware object 118 with the simulator.

In an example embodiment, the adapter layer 120 is sensitized to activity on the input ports of the HDL proxy component 112; the clock port is considered as a special instance case of an input port. Treating the clock port as such allows certain performance optimizations to be made in the adapter layer, for example, the adapter layer need not update the output port states if the value of an input port changes but the design does not include a combinational path. If these optimizations are not considered, the clock port need not be treated separately.

Events at the output ports do not need to be sensitized because the adapter layer, not the simulator, is responsible for causing the events. The adapter layer automatically adjusts output values on the output ports based on input port activity. Furthermore, the simulator 102 has no knowledge of the implementation or behavior of the realization of the specialized hardware object 118. Thus, the simulator cannot anticipate when an output port event will occur.

In an embodiment in which the clock port is treated as a special instance of an input port, activity at the clock port is handled by a clock event function 402 in the adapter layer 120 that handles activity on the component's clock port. The adapter layer uses activity on the clock port(s) (i.e., a rising edge) to keep track of simulation time. When the clock is pulsed in the simulator 102, the adapter layer issues a corresponding run instruction to the board interface layer. This allows the hardware to be kept in lockstep with the simulator.

FIG. 6 is a code block 402 of an example clock event function. The clock event function receives a specialized hardware object (104) (a specialization of a board interface layer 114) as an input parameter (404). It will be appreciated that even though the actual data structures used by different HDL simulators may vary, the concepts presented herein for functions associated with the input ports may be used in different simulators.

When the clock port is asserted, the hardware is stepped for one clock cycle (406). The clock is assumed to be active high (e.g., clk.getvalue( )==1). It is also possible to support an active low clock by changing the conditional expression (e.g., clk.getvalue( )==0). Because the output port values in hardware may have changed after the clock is stepped, a function, update_outputs (FIG. 8), is invoked (408) to update the output port values in the HDL simulator.

In a specific implementation, the functions associated with input ports may be implemented as callback functions. For example, the ModelSim FLI allows supports association of callback functions with various types of port events. By associating activity on input ports with callback functions, the adapter layer is sensitized such that an event on one of the ports causes the simulator to invoke the callback function which in turn calls the appropriate function in the board interface layer 114.

In the case of the ModelSim FLI, the HDL proxy communicates with a C model (e.g., a dynamically linked library (DLL) on Windows-based systems). Where VHDL code would normally be used to define the behavior of a component, a library module written in C such as a DLL is provided, and a link to this DLL is specified instead (e.g., ./hwcosim.dll 204 in FIG. 2). As a result, the C callback functions are defined entirely outside the HDL proxy component (in the C module).

In another implementation, the Verilog PLI embeds in the VHDL code C function calls to update functions that are invoked when an input port value changes. Instead of defining the simulation behavior of the component using a separate C model as in the ModelSim FLI, the Verilog PLI permits intermingling of C function calls with standard Verilog code. For example, traditional Verilog code may be used to wait for a signal value to change, and the PLI may be used to invoke a C function (in the adapter layer) to perform the necessary communication with the board interface layer. By using the Verilog PLI, the interface is independent of specific simulation tools.

Whereas the ModelSim FLI functions use FLI methods to extract information (e.g., port values) from the simulation environment, in the Verilog PLI the same port values may be passed as input parameters to the callback function by the calling Verilog code. The example code below shows a Verilog module that contains a procedure sensitized to input port signal "sig_1". The Verilog procedure code calls C function, "inp1_event_pli", whenever the value of this signal changes:

Always @(sig_1) // ← Verilog code
begin
    $inp1_event_pli(sig_1); //Invoke C callback function
end
endmodule FIG. 7 is a code block 432 of two example input port callback functions. Each input port has a unique function associated with it to handle events. The function inp1_event is associated with PORT_1, and the function inp2_event is associated with PORT_2. The functions that handle input port events are responsible for both input and output. Specifically, an input function updates the value of the specified input port register in hardware (434, 436) in response to an event at the associated input port. In addition, each function examines each output port register in hardware, and updates the corresponding port of the simulated HDL component accordingly (438, 440).

FIG. 8 is a code block 472 of an example update outputs function. In one embodiment, there is only one update function for all output ports. The output ports update function is called by an input port callback function whenever outputs may change due to clock or input change. The update outputs function iterates through the output ports (474) and sets each output port in the specialized hardware object 104 to the corresponding value from the realization of the specialized hardware object 118 (476).

Figure 9:
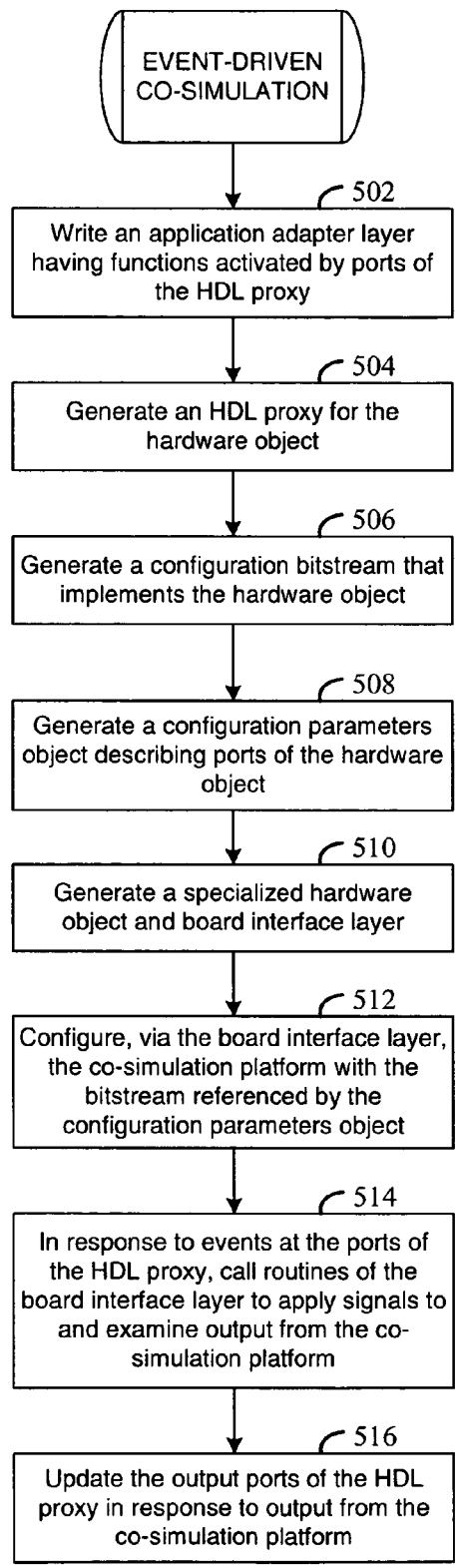
FIG. 9 is a flow diagram of a method for co-simulation in accordance with various embodiments of the invention.
Figure 10:
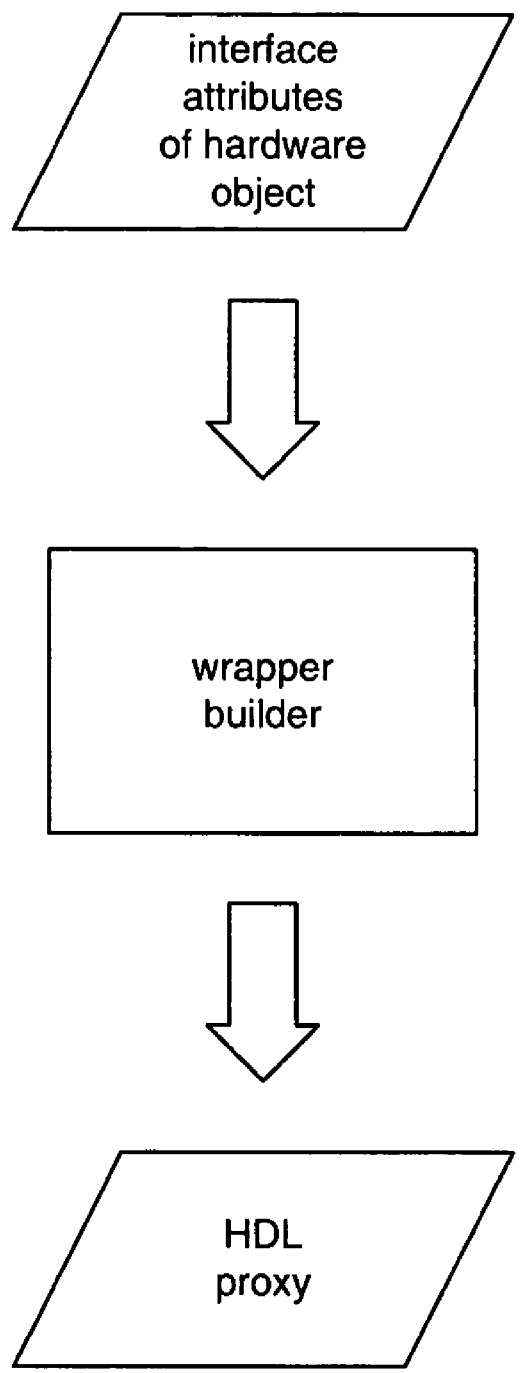

FIG. 9 is a flow diagram of a method for co-simulation in accordance with various embodiments of the invention. An adapter layer is written (step 502) for use with specialized hardware objects that are generated when a design is compiled. The adapter layer includes program code that implements callback functions associated with input ports of the hardware object to be co-simulated. The callback functions in the adapter layer are configured to call generalized functions (i.e., open, close, run, force, and examine) in a board interface layer. In one embodiment, the compilation process begins with generating an HDL proxy component for each hardware object that is to be co-simulated in hardware (step 504). The HDL proxy is generally an HDL wrapper in which the ports of the hardware object are defined and associated with the callback functions in the adapter layer.

In compiling a design for co-simulation, a configuration bitstream may be generated (step 506) for use in configuring a PLD to realize an implementation of a hardware object. When a simulation run is initialized, a configuration parameters object is generated (step 508) for communicating to a specialized hardware object, port definitions of the HDL proxy component, various characteristics about the behavior of the design, and the name and location of the configuration bitstream to use in configuring the PLD. The specialized hardware object is generated (step 510) to include a board interface layer. The board interface layer includes the generalized functions that are callable by the adapter layer, and these functions are adapted, by the maker of the board, to interface to a particular hardware-based co-simulation platform.

When simulation is initiated, the adapter layer calls the open function of the board interface layer, and the board interface layer initiates configuration of the PLD on the co-simulation platform with the bitstream specified by the configuration parameters object (step 512). The input port callback functions in the adapter layer call run and force functions of the board interface layer in response to events that appear at the input ports of the HDL proxy component (step 514). The input port callback functions in the adapter layer call an update outputs function, which is also in the application adapter layer, to check for output (step 516). The update outputs function calls the examine function in the board interface layer to obtain data from the output ports of the realization of the specialized hardware object, and the returned data is posted to the output ports in the HDL proxy.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for co-simulation and has been found to be particularly applicable and beneficial in event driven co-simulation using programmable logic circuitry. While various aspects of the invention have been described in terms of a specific PLD such an FPGA, it will be appreciated that the programmable logic circuitry of a PLD may be embedded in many different types of devices, and the invention is not limited to any particular type of PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for embedding a hardware object in an event-driven simulator, comprising:
   generating an HDL proxy component having an HDL definition of each port of the hardware object and respective event handler functions associated with input ports of the HDL proxy component and being responsive to simulation events appearing on the input ports;
   generating a configuration bitstream for implementing the hardware object on a programmable logic circuit;
   generating a first object containing configuration parameter values indicating characteristics of the ports and a location of the configuration bitstream;
   generating a second object, the second object being configured to initiate configuration of the programmable logic circuit with the configuration bitstream, provide input data to the programmable logic circuit in response to a function call by an event handler function associated with an input port in the HDL proxy component, and update an output port of the HDL proxy component in response to output data from the programmable logic circuit;
   configuring the event-driven simulator with the HDL Proxy component; and
   configuring the programmable logic circuit with the configuration bitstream.

2. The method of claim 1, wherein the HDL proxy component further includes at least one output port, the method further comprising:
   determining whether the hardware object has at least one combinational path that spans from an input port to an output port and that has no sequential elements;
   wherein the first object further indicates whether the hardware object has at least one combinational path; and
   deferring, in response to the design not having at least one combinational path, update of a state of an output port during simulation until a clock signal is applied to the HDL proxy component.

3. The method of claim 1, further comprising:
   wherein the event handler function is a callback function responsive to events at the input port of the HDL proxy component; and
   activating the callback function in response to an event at the input port.

4. The method of claim 3, further comprising:
   associating a clock-input callback function with a clock port of the HDL proxy component;
   activating the clock-input callback function in response to an event at the clock port, the second object being further configured to apply a number of cycles of a clock signal to the programmable logic circuit in response to a function call by the clock-input callback function; and
   applying the number of cycles of the clock signal to the programmable logic circuit in response to a function call to the second object by the clock-input callback function.

5. The method of claim 3, further comprising obtaining output data from the programmable logic circuit in response to activation of the callback function.

6. The method of claim 3, further comprising generating in the HDL proxy component an architecture definition that includes only a reference to a library of event handler functions.

7. The method of claim 3, further comprising generating in the HDL proxy component, calls to functions, specified in a language other than HDL, that are invoked when a value on an input port changes.

8. The method of claim 1, wherein the characteristics of the port indicate a width in bits of the port.

9. The method of claim 8, wherein the characteristics of the port indicate a signal flow direction of the port.

10. The method of claim 9, wherein the characteristics of the port include a port identifier.

11. The method of claim 1, wherein generating the HDL proxy component comprises:
    determining port characteristics of the hardware object in compiling a design for simulation; and
    specifying in a HDL in the HDL proxy component, definitions of the port characteristics.

12. An apparatus for embedding a hardware object in an event-driven simulator, comprising:

means for generating an HDL proxy component having an HDL definition of each port of the hardware object and respective event handler functions associated with input ports of the HDL proxy component and being responsive to simulation events appearing on the input ports;

means for generating a configuration bitstream for implementing the hardware object on a programmable logic circuit;

means for generating a first object containing configuration parameter values indicating characteristics of the ports and a location of the configuration bitstream;

means for generating a second object, the second object being configured to initiate configuration of the programmable logic circuit with the configuration bitstream, provide input data to the programmable logic circuit in response to a function calls by an event handler function associated with an input port in the HDL proxy component, and update an output port of the HDL proxy component in response to output data from the programmable logic circuit;

means for configuring the event-driven simulator with the HDL proxy component; and means for configuring the programmable logic circuit with the configuration bitstream.

13. A system for embedding a hardware object in an event-driven simulator, comprising:

an event-driven simulator;

an HDL proxy component coupled to the event-driven simulator and having an HDL definition of each port of the hardware object and respective event handler functions associated with input ports of the HDL proxy component and being responsive to simulation events appearing on the input ports;

a programmable logic circuit;

an application adapter coupled to the HDL proxy component, the application adapter configured to generate a first object containing configuration parameter values indicating characteristics of the ports and a location of a configuration bitstream that implements functions of the hardware object;

a second object coupled to the application adapter, the second object configured to initiate configuration of the programmable logic circuit with the configuration bitstream, provide input data to the programmable logic circuit in response to a function call by an event handler function associated with an input port in the HDL proxy component, and update an output port of the HDL proxy component in response to output data from the programmable logic circuit;

means for configuring the event-driven simulator with the HDL proxy component; and means for configuring the programmable logic circuit with the configuration bitstream.

14. The system of claim 13, further comprising:

wherein the HDL proxy component further includes at least one output port;

wherein the first object further indicates whether the hardware object has at least one combinational path that spans from an input port to an output port and that has no sequential elements; and wherein the second object is further configured to defer, in response to the design not having at least one combinational path, update of a state of an output port during simulation until a clock signal is applied to the HDL proxy component.

15. The system of claim 13, wherein the event handler function is a callback function activated in response to events at the input port of the HDL proxy component.

16. The system of claim 15, further comprising:

wherein a clock-input callback function is associated with a clock port of the HDL proxy component and activated in response to an event at the clock port, and wherein the second object is further configured to apply a number of cycles of a clock signal to the programmable logic circuit in response to a function call by the clock-input callback function.

17. The system of claim 15, wherein the callback function is further configured to obtain output data from the programmable logic circuit in response to activation of the callback function.

18. The system of claim 15, wherein the HDL proxy component includes an architecture definition that includes only a reference to a library of event handler functions.

19. The system of claim 15, wherein the HDL proxy component includes, calls to functions, specified in a language other than a HDL, that are invoked when a value on an input port changes.

20. The system of claim 13, wherein the characteristics of the port indicate a width in bits of the port.

21. The system of claim 20, wherein the characteristics of the port indicate a signal flow direction of the port.

22. The system of claim 21, wherein the characteristics of the port include a port identifier.

* * * * *